United States Patent
Anderson et al.

(10) Patent No.: US 7,920,016 B2
(45) Date of Patent: Apr. 5, 2011

(54) MONOLITHIC VOLTAGE REFERENCE DEVICE WITH INTERNAL, MULTI-TEMPERATURE DRIFT DATA AND RELATED TESTING PROCEDURES

(75) Inventors: Michael B. Anderson, Colorado Springs, CO (US); Tahir M. Hasoon, Menlo Park, CA (US); Brendan J. Whelan, Discovery Bay, CA (US); J. Spencer Wright, Sunnyvale, CA (US); Robert L. Reay, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 30 days.

(21) Appl. No.: 12/475,184

(22) Filed: May 29, 2009

(65) Prior Publication Data

US 2010/0301923 A1    Dec. 2, 2010

(51) Int. Cl.
*H01L 35/00* (2006.01)
(52) U.S. Cl. .................................................. 327/513
(58) Field of Classification Search ............... 327/512, 327/513, 534, 537, 539
See application file for complete search history.

(56) References Cited

U.S. PATENT DOCUMENTS

| | | | | |
|---|---|---|---|---|
| 5,053,640 A | * | 10/1991 | Yum | .............................. 327/539 |
| 5,319,370 A | | 6/1994 | Signore et al. | |
| 5,440,305 A | | 8/1995 | Signore et al. | |

FOREIGN PATENT DOCUMENTS

| EP | 07333909 A1 | 9/1996 |
|---|---|---|
| JP | 01123171 A1 | 5/1989 |

OTHER PUBLICATIONS

U.S. Appl. No. 12/475,184, "Monolithic Voltage Reference Device with Internal, Multi-Temperature Drift Data and Related Testing Procedures," Figure 1, Applicants' Admitted Prior Art, filed May 29, 2009.
Megaw, D. 2008. Voltage Reference Selection Basics. In Power Designer, published by National Semiconductor, Aug. 2008, pp. 1-11.
PCT Application No. PCT/US2010/036885 (corresponding to U.S. Appl. No. 12/475,184), International Search Report and Written Opinion of the International Searching Authority, mailed Sep. 14, 2010 by the European Patent Office as International Searching Authority.

* cited by examiner

*Primary Examiner* — Jeffrey S Zweizig
(74) *Attorney, Agent, or Firm* — McDermott Will & Emery LLP

(57) ABSTRACT

A testing procedure may determine whether a monolithic voltage reference device meets a temperature drift specification. A first non-room temperature output voltage of the monolithic voltage reference device may be measured while the monolithic voltage reference device is at a first non-room temperature which is substantially different than room temperature. First non-room temperature information may be stored in a memory within the monolithic voltage reference device which is a function of the first non-room temperature output voltage. A second non-room temperature output voltage of the monolithic voltage reference device may be measured while the monolithic voltage reference device is at a second non-room temperature which is substantially different than the room temperature and the first non-room temperature. Second non-room temperature information may be stored in the memory without destroying the first non-room temperature information which is a function of the second non-room temperature output voltage. A determination may be made whether the monolithic voltage reference device meets the temperature drift specification based on a computation that is a function of both the first non-room temperature information and the second non-room temperature information.

23 Claims, 3 Drawing Sheets

US 7,920,016 B2

MONOLITHIC VOLTAGE REFERENCE DEVICE WITH INTERNAL, MULTI-TEMPERATURE DRIFT DATA AND RELATED TESTING PROCEDURES

BACKGROUND

1. Technical Field

This disclosure relates to temperature drift in monolithic voltage reference devices, including procedures for determining whether such devices meet temperature drift specifications and circuits which compensate for such drift.

2. Description of Related Art

Monolithic voltage reference devices are used in various applications to provide a constant output voltage. This output voltage, however, can drift when the temperature of the monolithic device changes.

Monolithic voltage reference devices are commonly sold with a temperature drift specification which states that the output voltage will not drift by more than a specified amount over a specified temperature range.

During manufacture, tests may be run to determine whether a monolithic voltage reference device is performing within this temperature drift specification. However, these tests sometime reject or downgrade a part which, in fact, meets the temperature drift specification.

SUMMARY

A testing procedure may determine whether a monolithic voltage reference device meets a temperature drift specification. A first non-room temperature output voltage of the monolithic voltage reference device may be measured while the monolithic voltage reference device is at a first non-room temperature which is substantially different than room temperature. First non-room temperature information may be stored in a memory within the monolithic voltage reference device which is a function of the first non-room temperature output voltage. A second non-room temperature output voltage of the monolithic voltage reference device may be measured while the monolithic voltage reference device is at a second non-room temperature which is substantially different than the room temperature and the first non-room temperature. Second non-room temperature information may be stored in the memory without destroying the first non-room temperature information which is a function of the second non-room temperature output voltage. A determination may be made whether the monolithic voltage reference device meets the temperature drift specification based on a computation that is a function of both the first non-room temperature information and the second non-room temperature information.

A monolithic voltage reference device may include a voltage reference circuit configured to provide a substantially constant output voltage and a memory. The memory may contain within it first non-room temperature information which is a function of an output voltage of the monolithic voltage reference device measured while the monolithic voltage reference device was tested at a first non-room temperature which was substantially different than a room temperature. The memory may also contain within it second non-room temperature information which is a function of an output voltage of the monolithic voltage reference device measured while the monolithic voltage reference device was tested at a second non-room temperature which was substantially different from the first non-room temperature and the room temperature. A monolithic package may contain both the voltage reference circuit and the memory. The monolithic voltage reference device may be configured to receive a query from a source external to the monolithic package and to return in response the temperature information which is stored in the memory.

A temperature-compensated electronic system may include an electronic subsystem that requires a substantially constant reference voltage, a monolithic voltage reference device of one of the types discussed above, a temperature sensor configured to provide real-time temperature information about the temperature of the monolithic voltage reference device, and a temperature compensation system. The temperature compensation system may be configured to receive the real-time temperature information from the temperature sensor, read first non-room and second non-room temperature information from a memory within the monolithic voltage reference device, and provide compensation to the electronic subsystem for changes in the output voltage of the monolithic voltage reference device caused by changes in the temperature of the monolithic voltage reference device. This compensation may be based on the real-time temperature information and the first non-room and second non-room temperature information.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it is intended to refer to the same or like components or steps.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Figure 1:
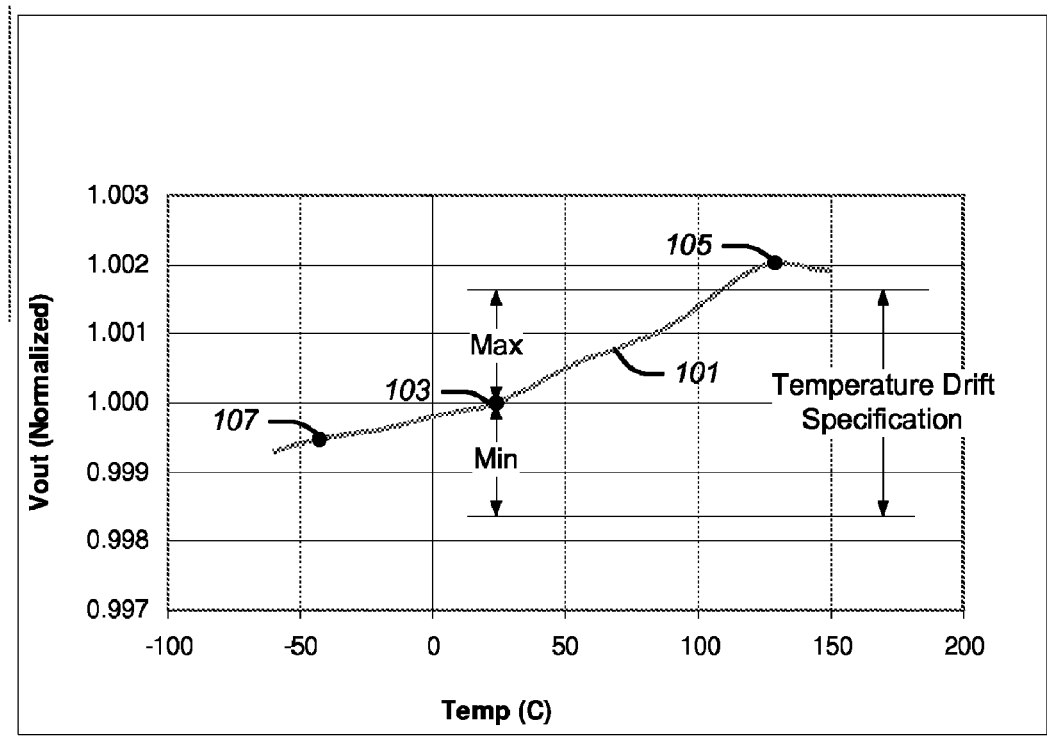
FIG. 1 illustrates drift in the output voltage of a monolithic voltage reference device as a function of temperature, along with the results of a prior art testing procedure which indicate that the part should not be certified as meeting a temperature drift specification when, in fact, the part meets this specification.

FIG. 1 illustrates drift in the output voltage of a monolithic voltage reference device as a function of temperature, along with the results of a prior art testing procedure which indicate that the part should not be certified as meeting a temperature drift specification when, in fact, the part meets this specification.

As illustrated in FIG. 1, an output voltage 101 of a monolithic voltage reference device may drift as a function of temperature.

In the past, the output voltage of a monolithic voltage reference device was tested at different test stations, each at a different temperature. One test station, for example, tested the device at room temperature, while another station tested the device at a high temperature, while a still further station tested the device at a low temperature, resulting in room, high, and low temperature output voltages 103, 105, and 107, respectively.

"Room temperature" as used herein is intended to refer to the normal temperature at which people live, which is typically regarded to be at about 25 degrees Celsius.

After being tested at a room temperature station, the difference between the output voltage and its ideal value was recorded as a room temperature error in a memory within the device. While the device was being tested at the high temperature and the low temperature test stations, these stations read the room temperature error from the memory in the device. The high and low temperature test stations each then compared the difference between the output voltage measured at their station and the room temperature output voltage based on the room temperature error that was read. This difference was then compared to a pre-determined threshold, such as a Max value at the high temperature test station and a Min value at the low temperature test station, as illustrated in FIG. 1. If either difference exceeded its associated pre-determined threshold, as it does for the high temperature output voltage 105 in FIG. 1, the device was rejected or downgraded.

This testing procedure sometimes rejected or downgraded a device which, in fact, met the temperature drift specification of the device. The reason for this is because of the nature of the temperature drift specification for the device and the type of testing procedure and device which was used.

The temperature drift specification of a voltage reference device commonly states that the output voltage of the device will not deviate by more than a specified amount over a specified temperature range. This is commonly referred to as the "box method" of specifying a temperature drift specification.

As illustrated in FIG. 1, the prior art testing procedure compared the output voltage at each of two non-room temperatures with the output voltage at room temperature. In order to insure that the device's temperature drift specification was not exceeded, the deviation between each of these comparisons was prohibited from exceeding a certain portion of the temperature drift specification, namely the Min value and the Max value, the sum of which was no more than the range of the temperature drift specification.

For example, the temperature drift specification for a monolithic voltage reference device may state that the output voltage will not vary by more than 10 millivolts over a specified temperature range. The pre-determined Max value, therefore, may have been set to 5 millivolts above a reference voltage, while the predetermined Min value may also have been set to 5 millivolts below that reference voltage. Satisfaction of both of these limits thus insured that the device met the temperature drift specification.

As illustrated in FIG. 1, the high temperature output voltage 105 exceeded the allocated Max amount. Thus, this device may have been rejected or downgraded, as indicated above. Yet, the total deviation of the output voltage over the tested temperature range may have been less than the temperature drift specification. Thus, this device met the temperature drift specification, but may have been needlessly rejected or downgraded.

Figure 2:
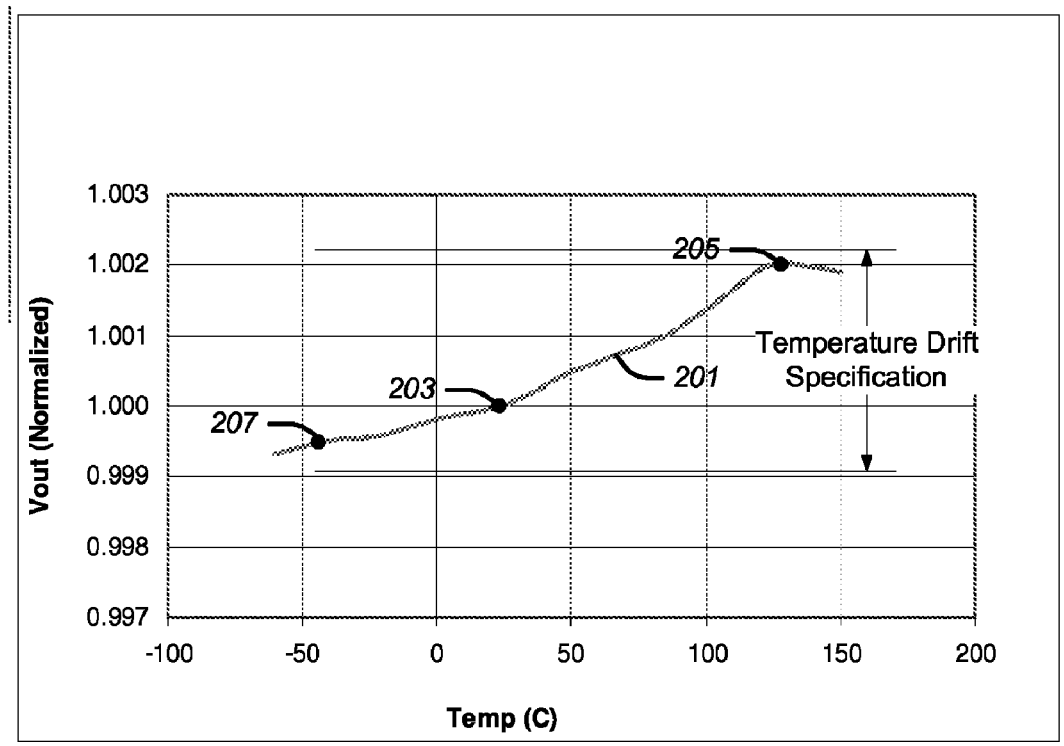
FIG. 2 illustrates the output voltage of a modified monolithic voltage reference device as a function of temperature that drifts in the same way as the output voltage illustrated in FIG. 1, along with the results of a new testing procedure which correctly indicates that the modified device should be certified as meeting the same temperature drift specification.

FIG. 2 illustrates the output voltage of a modified monolithic voltage reference device as a function of temperature that drifts in the same way as the output voltage illustrated in FIG. 1, along with the results of a new testing procedure which correctly indicates that the modified device should be certified as meeting the same temperature drift specification.

As illustrated in FIG. 2, the output voltage 201 drifts in the same way as a function of temperature as the output voltage illustrated in FIG. 1. Each of the test stations, moreover, test the output voltage at the same temperatures to produce a room temperature output voltage 203, a high temperature output voltage 205, and a low temperature output voltage 207. However, a different testing procedure and configuration of the monolithic voltage reference device is used, as will be described below. The result of this different procedure and modified device is to permit a temperature drift characteristic of the device to be computed in a manner which is more consistent with the box method of specifying its temperature drift specification, thus reducing the chance that the device will be rejected or downgraded when, in fact, it meets the temperature drift specification.

In essence, the temperature drift specification in FIG. 1 is permitted to slide vertically (upwardly in this case) in FIG. 2 and is implemented as a range of acceptable output voltages that may slide vertically relative to a reference value, such as an output voltage measured at room temperature. When all of the measured voltage outputs fall within this window, this may correctly be interpreted as meaning that the modified device meets the temperature drift specification. Details of this testing procedure and the modified monolithic voltage reference device that collectively facilitate this enhanced measurement accuracy are now described.

Figure 3:
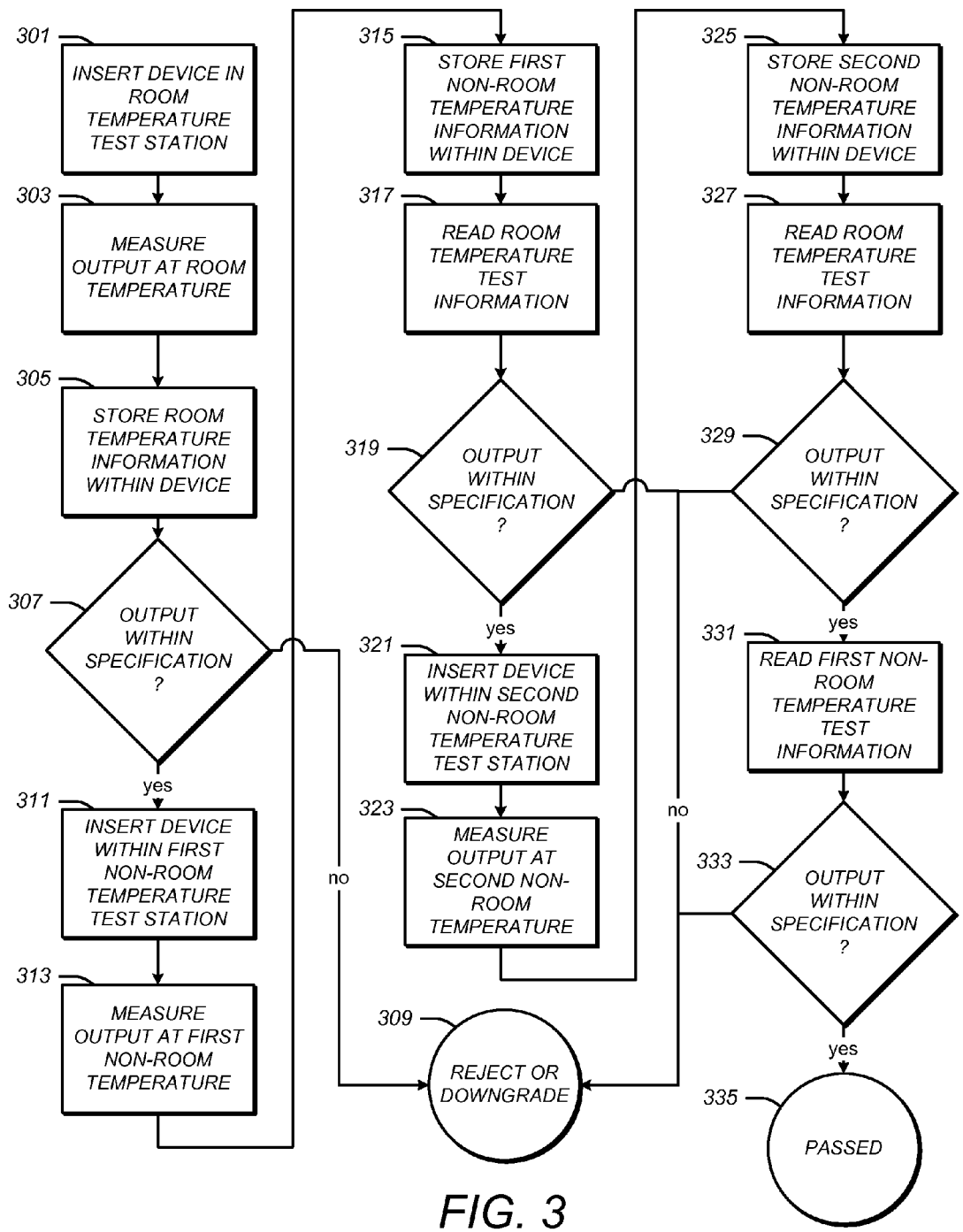
FIG. 3 illustrates a testing procedure for determining whether a modified monolithic voltage reference device meets a temperature drift specification.

FIG. 3 illustrates a testing procedure for determining whether a modified monolithic voltage reference device meets a temperature drift specification.

A modified monolithic voltage reference device may be inserted in a room temperature test station, as illustrated by an Insert Device In Room Temperature Test Station step 301. The output voltage of the device may be measured at room temperature while within the room temperature test station, as illustrated by a Measure Output At Room Temperature step 303. Room temperature information which is a function of the room temperature output voltage may be stored in a memory within the device, as reflected by a Store Room Temperature Information Within Device step 305.

Any type of room temperature information may be stored. For example, data representing the actual room temperature output voltage may be stored. To minimize the size of the storage space, while still allowing a high degree of resolution, an error value may be stored instead. The error value may represent a difference between the measured room temperature output voltage and a room temperature reference voltage.

The room temperature test station may determine whether the measured room temperature output voltage falls within a specified range for the device, as reflected by an Output Within Specification? decision step 307. If the device fails to meet this test, the device may be rejected or downgraded, as reflected in a Reject or Downgrade step 309. The specified range may be in any amount, such as an amount which is less than the range of the temperature drift specification.

If the device passes this test, the device may be removed from the room temperature test station and inserted within a first non-room temperature test station that may be physically separated from the room temperature test station, as reflected by an Insert Device Within First Non-Room Temperature Test Station step 311.

The first non-room temperature test station may be configured to substantially alter the room temperature of the device. For example, the first non-room temperature test station may be configured to heat the device to the maximum or cool the device to the minimum of the device's operating temperature specification. In an alternative embodiment, the first non-room temperature test station may be configured to heat the device to a temperature within the operating temperature specification at which the output voltage of devices of the same type typically drifts to a peak or to a valley temperature.

While at the first non-room temperature test station and while at the temperature imposed by the first non-room temperature test station, the output voltage of the device may be measured, as reflected by a Measure Output At First Non-Room Temperature step 313. Temperature information which is a function of this measured output voltage may be stored in a memory of the monolithic voltage reference device while it is at the first non-room temperature test station in a manner that preserves the temperature information which was stored in the memory while it was at the room temperature test station, as reflected in a Store First Non-Room Temperature Information Within Device step 315. The data which is stored may be representative of the measured output voltage or of an error between the measured output voltage and a first non-room temperature reference voltage.

While at the first non-room temperature test station, the room temperature information which was stored in the memory of the device may be read, as reflected by a Read Room Temperature Test Information step 317.

The measured output voltage of the device while at the first non-room temperature may be analyzed to determine whether the device is still in compliance with its temperature drift specification, as reflected by an Output Within Specification? decision step 319. One or more computations may be performed as part of this decision step. For example, a determination may be made as to whether the output voltage falls within a specified range, just like was done in connection with the Output Within Specification? decision step 307 at the room temperature station. The range which is used may or may not be the same as the range which was used in determining the Output Within Specification? decision step 319. If the device fails this test, it may be rejected or downgraded, as reflected by the Reject or Downgrade step 309.

If the device passes this test, a second computation may be performed at the first non-room temperature test station. For example, the amount of drift in the output voltage between when the device was tested at room temperature and when it was tested at the first non-room temperature may be computed and compared against a maximum. If the difference is more than the maximum, the device may be rejected or downgraded, as reflected by the Reject or Downgrade step 309. This maximum may be substantially more than 50% of the maximum deviation that is part of the device's temperature drift specification.

If the device passes the one or more tests which are part of the Output Within Specification? decision step 319, the device may be removed from the first non-temperature test station and inserted into a second non-temperature test station, as reflected by an Insert Device Within Second Non-Room Temperature Test Station step 321.

The second non-room temperature test station may be physically separated from both the room temperature test station and the first non-room temperature test station. The second non-room temperature test station may be configured to heat or cool the device to a temperature that is substantially different from both the room temperature and the first non-room temperature. For example, the second non-room temperature test station may be configured to heat the device to the maximum or cool it to the minimum of the device's operating temperature specification. In an alternative embodiment, the second non-room temperature test station may be configured to heat the device to a temperature within the operating temperature specification of the device at which the output voltage of devices of the same type typically drifts to a peak or a valley temperature.

While at the second non-room temperature test station, a measuring, storing, reading, and determining step may be performed, as reflected by a Measure Output At Second Non-Room Temperature step 323, a Store Second Non-Room Temperature Information Within Device step 325, a Read Room Temperature Test Information step 327, and an Output Within Specification? decision step 329. Each of these steps may be performed in the same way and be subject to the same characteristics, variations, and considerations that are discussed above in connection with the identically-named steps that were performed while the device was at the first non-room temperature test station.

During the Store Second Non-Room Temperature Information Within Device step 325, moreover, second non-room temperature information may be stored within the memory of the device without altering the room temperature information or the first non-room temperature information. The information which is stored may be representative of the measured output voltage or of an error between the measured output voltage and a second non-room temperature reference voltage.

If the device passes the test or tests which are part of the Output Within Specification? decision step 329, the first non-room temperature test information which is within the memory of the device may be read while the device is within the second non-room temperature test station, as reflected by a Read First Non-Room temperature Test Information step 331. Based on both the first and the second non-room temperature information, a further determination may be made as to whether the device meets the temperature drift specification, as reflected by an Output Within Specification? decision step 333. If it does, the device may be passed, as reflected by a Passed step 335. If it does not, the device may be rejected or downgraded, as reflected by the Reject or Downgrade step 309.

During the Output Within Specification? decision step 333, a computation may be made that is a function of both the first and the second non-room temperature information. For example, one of the output voltages at the two non-room temperatures may be subtracted from the other and divided by the difference between the temperatures at which they were taken. The result may be multiplied by an appropriate constant and compared to the temperature drift specification.

Numerous variations to the testing procedure illustrated in FIG. 3 may be made. For example, the device may not be tested at room temperature or, if it is, room temperature information about the test may not be stored within the memory of the device.

Conversely, the device may be tested more than once at room temperature. For example, the device may be tested at room temperature before it is heated or cooled and, after being heated and/or cooled, tested again at room temperature. Thermal hysteresis in the material which is used to construct the device may cause these readings to be different. Both of the readings may be used during the evaluation process. The output voltage of the device may also be tested at more than two non-room temperatures. All, part, or none of this additional information may be stored in the memory of the device, either with data representing the output voltages or error amounts, along with all of the other temperature information. Further, all of the non-room temperatures at which the device is tested may be higher or lower than room temperature.

The sequence of the steps may also be different. For example, temperature information about the measured voltage output of the device while at a test station may be stored in the memory of the device only after the device is determined to have passed a test at that station.

The number of steps may also be different. For example, there may be additional steps and/or some of the steps may be omitted.

The device may or may not also have stored within it a unique serial number which distinguishes the device from all others of the same type.

Figure 4:
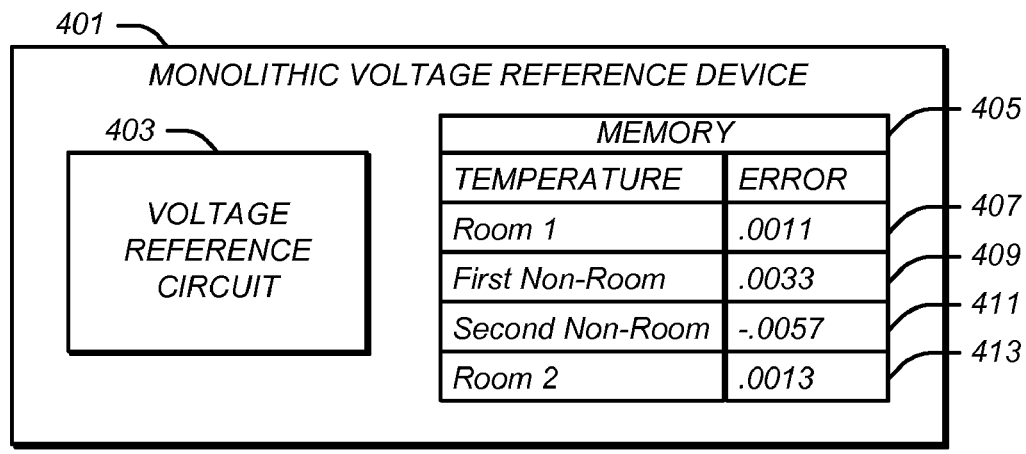
FIG. 4 illustrates a modified monolithic voltage reference device which includes a memory having multiple output voltage error values stored within it.

FIG. 4 illustrates a monolithic voltage reference device which includes a memory having multiple output voltage error values stored within it. As illustrated in FIG. 4, a monolithic voltage reference device 401 may include a voltage reference circuit 403 and a memory 405. All of the components of the monolithic voltage reference device, such as the voltage reference circuit 403 and the memory 405, may be contained within a single monolithic package.

The voltage reference circuit 403 may be configured to provide a substantially constant output voltage and may be of any type. It may include, for example, a Bandgap reference.

The memory 405 may be of any type. For example, it may include one or more EPROMS, which may include one or more poly fuses or film fuses. It may be configured to hold various data. The data may be representative of temperature information, such as any of the types of temperature information discussed above. For example, the memory 405 may contain data which is representative of an error in the output voltage of the monolithic voltage reference device 401 when it was tested at a first room temperature, as reflected by a Room 1 Error 407, at a first non-room temperature, as reflected by a First Non-Room Error 409, a second non-room temperature, as reflected by Second Non-Room Error 411, and/or at a second room temperature, as reflected by Room 2 Error 413. The data may be in any format. For example, a 2s complement binary code may be used.

The monolithic voltage reference device which is illustrated in FIG. 4 may be tested using the testing procedure which is illustrated in FIG. 3 or any other testing procedure. Similarly, the testing procedure which is illustrated in FIG. 3 may be used to test any other type of monolithic voltage reference device.

The memory 405 may or may not contain a unique serial number which, when present, may distinguish the monolithic voltage reference device 401 from all other devices of the same type.

The monolithic voltage reference device may be configured to receive a query from a source external to the monolithic package and to return in response the temperature information which is stored in the memory 405.

Figure 5:
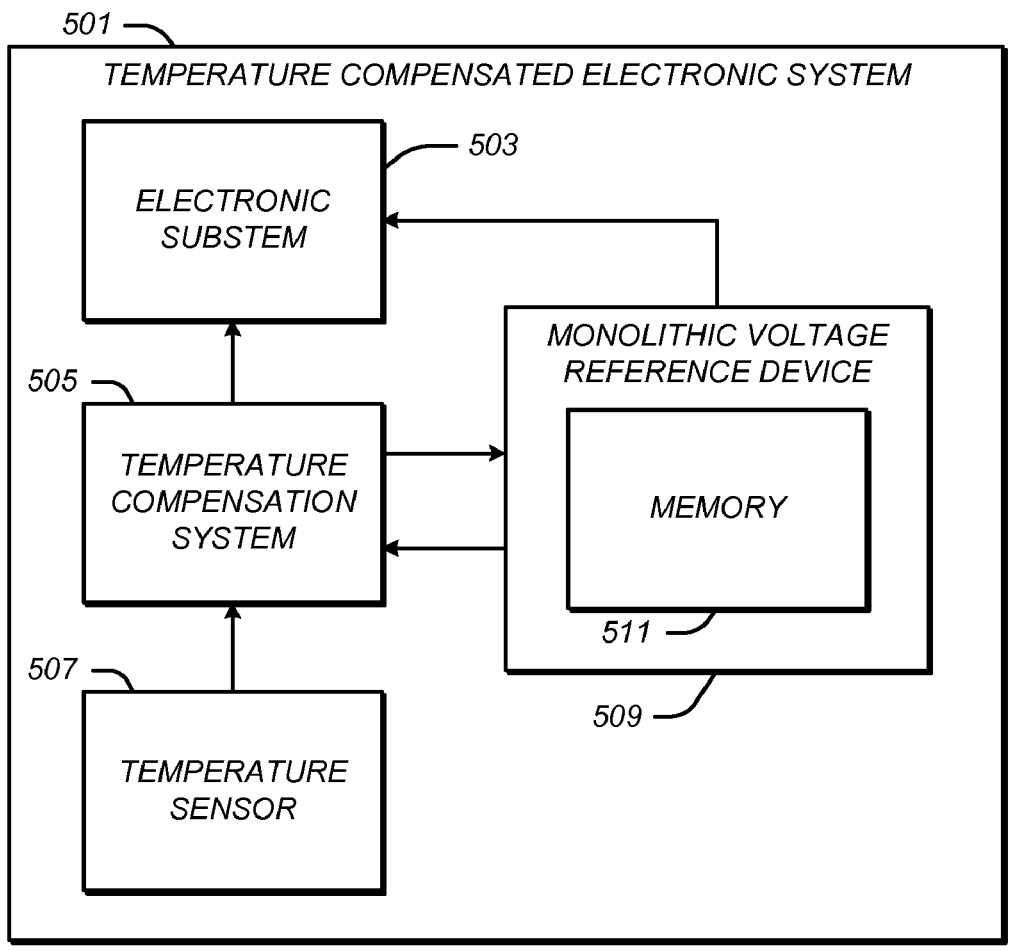
FIG. 5 illustrates a temperature-compensated electronic system which includes the modified monolithic voltage reference device illustrated in FIG. 4.

FIG. 5 illustrates a temperature-compensated electronic system which includes the monolithic voltage reference device illustrated in FIG. 4. As illustrated in FIG. 5, a temperature compensated electronic system 501 may include an electronic subsystem 503, a temperature compensation system 505, a temperature sensor 507, and a monolithic voltage reference device 509. The monolithic voltage reference device 509 may be separate from all of the other components of the system.

The electronic subsystem 503 may be of any type and may require a substantially constant reference voltage. For example, the electronic subsystem may be a battery monitor, electronic scale, electronic thermometer, sensor-based measurement system, warning system, or any other system that measures or compares.

The monolithic voltage reference device 509 may be configured to provide a substantially constant voltage to the electronic subsystem 503. The monolithic voltage reference device may be any of the types of monolithic voltage reference devices discussed above, such as the monolithic voltage reference device illustrated in FIG. 4. The monolithic voltage reference device may include a memory 511, which may be configured to hold information about the output voltage of the monolithic voltage reference device 509 under various test temperatures, such as the temperature information illustrated in FIG. 4 in the memory 405 and/or any of the other types of temperature information discussed above.

The temperature sensor 507 may be of any type. The temperature sensor 507 may be configured to provide real-time temperature information to the temperature compensation system 505 about the temperature of the monolithic voltage reference device 509.

The temperature compensation system 505 may be configured to receive the real-time temperature information from the temperature sensor 507. It may also be configured to query the monolithic voltage reference device 509 for the temperature information which is contained within the memory 511 and to receive the temperature information in response.

The temperature compensation system 505 may be configured to provide compensation to the electronic subsystem 503 for changes in the output voltage of the monolithic voltage reference device 509 caused by changes in the temperature of the monolithic voltage reference device 509. It may be configured to do so based on the real-time temperature information which it receives from the temperature sensor 507 and the temperature information which it receives from the memory 511 in the monolithic voltage reference device 509. This compensation may reduce adverse effects on the electronic subsystem 503 which changes in the output voltage of the monolithic voltage reference device 509 as a function of temperature might otherwise cause.

The components, steps, features, objects, benefits and advantages that have been discussed throughout this disclosure are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

For example, although the various test stations have been described as being physically separated, they could instead be implemented by a single test station at which the temperature of the device is changed.

Although having described the temperature specification as conforming to the box method, it could instead conform to any other method, such as the butterfly method.

The procedures which have been discussed may be used to reject or downgrade devices which otherwise might not have been rejected or downgraded by other procedures. For example, the procedures which have been discussed may be used to reject or downgrade devices which might not have been rejected or downgraded by procedures which only test the device at room temperature and/or at one other temperature.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials that have been described and their equivalents. Similarly, the phrase "step for" when used in a claim embraces the corresponding acts that have been described and their equivalents. The absence of these phrases means that the claim is not intended to and should not be interpreted to be limited to any of the corresponding structures, materials, or acts or to their equivalents.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

The invention claimed is:

1. A testing procedure for determining whether a monolithic voltage reference device meets a temperature drift specification, the testing procedure comprising:
   measuring a first non-room temperature output voltage of the monolithic voltage reference device while the monolithic voltage reference device is at a first non-room temperature which is substantially different than room temperature;
   storing first non-room temperature information in a memory within the monolithic voltage reference device which is a function of the first non-room temperature output voltage;
   measuring a second non-room temperature output voltage of the monolithic voltage reference device while the monolithic voltage reference device is at a second non-room temperature which is substantially different than the room temperature and the first non-room temperature;
   storing second non-room temperature information in the memory without destroying the first non-room temperature information which is a function of the second non-room temperature output voltage; and
   determining whether the monolithic voltage reference device meets the temperature drift specification based on a computation that is a function of both the first non-room temperature information and the second non-room temperature information.

2. The testing procedure of claim 1 wherein the function includes subtracting a value based on the first non-room temperature information from a value based on the second non-room temperature information.

3. The testing procedure of claim 1 wherein:
   the first non-room temperature information represents an amount of error between the first non-room temperature output voltage and a first non-room temperature reference voltage; and
   the second non-room temperature information represents an amount error between the second non-room temperature output voltage and a second non-room temperature reference voltage.

4. The testing procedure of claim 1 wherein:
   the measuring of the first non-room temperature output voltage and the storing of the first non-room temperature information is performed at a first non-room temperature test station; and
   the measuring of the second non-room temperature output voltage and the storing of the second non-room temperature information is performed at a second non-room temperature test station.

5. The testing procedure of claim 4 wherein the second non-room temperature test station is physically separated from the first non-room temperature test station.

6. The testing procedure of claim 4 wherein:
   the monolithic voltage reference device is tested at the first non-room temperature test station before being tested at the second non-room temperature test station;
   the first non-room temperature information is read from the memory by the second non-room temperature test station; and
   the determining whether the monolithic voltage reference device meets the temperature drift specification is performed at the second non-room temperature test station based in part on the first non-room temperature information.

7. The testing procedure of claim 1 further comprising:
   measuring a room temperature output voltage of the monolithic voltage reference device while the monolithic voltage reference device is at the room temperature;
   storing room temperature information in the memory which is a function of the room temperature output voltage,
   wherein the first non-room, the second non-room, and the room temperature information is stored simultaneously in the memory.

8. The testing procedure of claim 7 wherein the room temperature information represents an error between the room temperature output voltage and a room temperature reference voltage.

9. The testing procedure of claim 7 wherein:
   the measuring of the room temperature output voltage and the storing of the room temperature information is performed at a room temperature test station;
   the measuring of the first non-room temperature output voltage and the storing of the first non-room temperature information is performed at a first non-room temperature test station; and
   the measuring of the second non-room temperature output voltage and the storing of the second non-room temperature information is performed at a second non-room temperature test station which is physically separated from the room temperature test station and the first non-room temperature test station.

10. The testing procedure of claim 9 wherein the first non-room temperature test station is physically separated from the room temperature test station.

11. The testing procedure of claim 9 further comprising:
determining whether the monolithic voltage reference device meets the temperature drift specification while at the room temperature test station based on the room temperature information;
determining whether the monolithic voltage reference device meets the temperature drift specification while at a first non-room temperature test station based on a computation that is a function of the room temperature information and the first non-room temperature information; and
determining whether the monolithic voltage reference device meets the temperature drift specification while at the second non-room temperature test station based on a computation that is a function of both the first non-room and the second non-room temperature information.

12. The testing procedure of claim 11 wherein the determining whether the monolithic voltage reference device meets the temperature drift specification at the second non-room temperature test station is also based on the room temperature information.

13. The testing procedure of claim 11 wherein:
the room temperature information is read from the memory at the first non-room temperature test station; and
the first non-room temperature information is read from the memory at the second non-room temperature test station.

14. The testing procedure of claim 7 further comprising:
measuring a second room temperature output voltage of the monolithic voltage reference device while the monolithic voltage reference device is at the room temperature a second time; and
storing second room temperature information which is a function of the second room temperature output voltage;
wherein the first non-room, the second non-room, the room, and the second room temperature information is stored simultaneously in the memory.

15. The testing procedure of claim 1 wherein:
the monolithic voltage reference device has a maximum and a minimum operating temperature specification; and
the first non-room and the second non-room temperatures are approximately equal to the maximum and the minimum operating temperature specification, respectively, or vice versa.

16. The testing procedure of claim 1 wherein:
the output voltage of monolithic voltage reference devices of the same type as the monolithic voltage reference device usually drift to a maximum at a peaking temperature within an operating temperature specification and to a minimum at a valley temperature within the operating temperature specification; and
the first non-room and the second non-room temperatures are substantially equal to peaking and the valley temperature, respectively, or vice versa.

17. The testing procedure of claim 1 wherein:
the temperature drift specification has a corresponding output voltage range; and
the first or the second non-room temperature information indicates a drift in the first or the second non-room test output voltage with respect to the room temperature output voltage that is in excess of 50% of the range; and
the monolithic voltage reference device is nevertheless determined to meet the temperature drift specification.

18. The testing procedure of claim 1 wherein the first and the second non-room temperatures are substantially above and below the room temperature, respectively, or vice versa.

19. The testing procedure of claim 1 further comprising:
measuring a fourth temperature output voltage of the monolithic voltage reference device while the monolithic voltage reference device is at a fourth temperature that is substantially different from the first non-room, the second non-room, and the room temperature; and
storing fourth temperature information in the memory which is a function of the fourth temperature output voltage.

20. The testing procedure of claim 1 further comprising not storing any type of unique serial number in the monolithic voltage reference device.

21. A temperature-compensated electronic system comprising:
an electronic subsystem that requires a substantially constant reference voltage;
a monolithic voltage reference device comprising:
a voltage reference circuit configured to provide a substantially constant output voltage;
a memory containing within it:
first non-room temperature information which is a function of an output voltage of the monolithic voltage reference device measured while the monolithic voltage reference device was tested at a first non-room temperature which was substantially different than a room temperature; and
second non-room temperature information which is a function of an output voltage of the monolithic voltage reference device measured while the monolithic voltage reference device was tested at a second non-room temperature which was substantially different from the first non-room temperature and the room temperature; and
a monolithic package containing both the voltage reference circuit and the memory but not the electronic subsystem,
wherein the monolithic voltage reference device is configured to receive a query from a source external to the monolithic package and to return in response the temperature information which is stored in the memory;
a temperature sensor external to the monolithic package configured to provide real-time temperature information about the temperature of the monolithic voltage reference device;
a temperature compensation system external to the monolithic package configured to:
receive the real-time temperature information from the temperature sensor;
read the first non-room and second non-room temperature information from the memory within the monolithic voltage reference device; and
provide compensation to the electronic subsystem for changes in the output voltage of the monolithic voltage reference device caused by changes in the temperature of the monolithic voltage reference device based on the real-time temperature information and the first non-room and second non-room temperature information.

22. The temperature-compensated electronic system of claim 21 wherein:
the first non-room temperature information represents an amount of error between the first non-room temperature output voltage and a first non-room temperature reference voltage; and the second non-room temperature information represents an amount error between the second non-room temperature output voltage and a second non-room temperature reference voltage.

23. The temperature-compensated electronic system of claim 21 wherein:
the memory also contains room temperature information which is a function of an output voltage of the monolithic voltage reference device measured while the monolithic voltage reference device was tested at room temperature; and the temperature compensation system is also configured to:
read the room temperature information from the monolithic voltage reference device; and
provide compensation to the electronic subsystem for changes in the output voltage of the monolithic voltage reference device caused by changes in the temperature of the monolithic voltage reference device based also on the room temperature information.

* * * * *